(12) United States Patent
Qiu

(10) Patent No.: US 12,354,971 B2
(45) Date of Patent: Jul. 8, 2025

(54) SEMICONDUCTOR STRUCTURE, METHOD FOR MANUFACTURING SAME AND MEMORY

(71) Applicant: CHANGXIN MEMORY TECHNOLOGIES, INC., Hefei (CN)

(72) Inventor: Shaowen Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 564 days.

(21) Appl. No.: 17/837,197

(22) Filed: Jun. 10, 2022

(65) Prior Publication Data

US 2023/0071603 A1 Mar. 9, 2023

Related U.S. Application Data

(63) Continuation of application No. PCT/CN2022/070600, filed on Jan. 6, 2022.

(30) Foreign Application Priority Data

Sep. 8, 2021 (CN) .......................... 202111051957.5

(51) Int. Cl.
*H01L 23/544* (2006.01)
*G03F 7/09* (2006.01)
(Continued)

(52) U.S. Cl.
CPC ............ *H01L 23/544* (2013.01); *G03F 7/094* (2013.01); *G03F 9/7076* (2013.01); *H01L 21/0273* (2013.01); *H01L 2223/54426* (2013.01)

(58) Field of Classification Search
CPC ............... H01L 23/544; H01L 21/0273; H01L 2223/54426; G03F 7/094; G03F 9/7076;
(Continued)

(56) References Cited

U.S. PATENT DOCUMENTS 7,483,156 B2 1/2009 Cho
2006/0078808 A1 4/2006 Cho
(Continued)

FOREIGN PATENT DOCUMENTS

CN 101789386 A 7/2010
CN 103065929 A 4/2013
(Continued)

*Primary Examiner* — Caleen O Sullivan
(74) *Attorney, Agent, or Firm* — Kilpatrick Townsend & Stockton LLP

(57) ABSTRACT

A semiconductor structure, a method for manufacturing the same and a memory are provided. The semiconductor structure at least includes two photolithography layers which are arranged in sequence and at least one blocking layer. Each photolithography layer includes a functional pattern and an overlay mark, and the photolithography layers include a first photolithography layer and a second photolithography layer. The first photolithography layer includes a first functional pattern and a first overlay mark, and the second photolithography layer includes a second functional pattern and a second overlay mark; and at least one blocking layer. The blocking layer is located between the first functional pattern and the second functional pattern, and a vertical distance between the first functional pattern and the second functional pattern is greater than a vertical distance between the first and second overlay marks, in a stacking direction of the photolithography layers.

15 Claims, 3 Drawing Sheets

(51) Int. Cl.
*G03F 9/00* (2006.01)
*H01L 21/027* (2006.01)
(58) Field of Classification Search
CPC  G03F 7/70633; G03F 7/70683; H10B 12/482
USPC .............................. 430/22, 313, 311; 257/14
See application file for complete search history.

(56) References Cited

U.S. PATENT DOCUMENTS

| 2007/0063317 | A1* | 3/2007 | Kim .................... G03F 7/70633 |
| | | | 257/E23.179 |
| 2012/0038021 | A1* | 2/2012 | Chen .................... G03F 9/7084 |
| | | | 430/323 |
| 2020/0013724 | A1* | 1/2020 | Chen .................. H01L 21/0276 |

FOREIGN PATENT DOCUMENTS

| CN | 109932872 A | 6/2019 |
| CN | 111162056 A | 5/2020 |
| CN | 111324019 A | 6/2020 |

\* cited by examiner

SEMICONDUCTOR STRUCTURE, METHOD FOR MANUFACTURING SAME AND MEMORY

CROSS-REFERENCE TO RELATED APPLICATIONS

This application is a U.S. continuation application of International Application No. PCT/CN2022/070600, filed Jan. 6, 2022, which claims priority to Chinese Patent Application No. 202111051957.5, filed Sep. 8, 2021. International Application No. PCT/CN2022/070600 and Chinese Patent Application No. 202111051957.5 are incorporated herein by reference in their entireties.

BACKGROUND

A photolithography process is a process of transferring a mask pattern to a wafer by a series of procedures such as alignment and exposure. In the manufacturing process of a semiconductor structure, it is usually necessary to adopt multiple photolithography processes to realize an overlay. However, due to various factors of the photolithography process that can't reach an ideal state, a pattern left on the wafer by exposure and development can't be completely aligned with an existing pattern on the wafer. Therefore, it is necessary to accurately measure an offset between the pattern left on the wafer by exposure and development and the existing pattern on the wafer, i.e. an overlay error, so that the overlay error can be effectively compensated and corrected in a subsequent process, and thus a final semiconductor structure has an expected effect.

SUMMARY

Embodiments of the disclosure relates to, but is not limited to, a semiconductor structure, a method for manufacturing the same, and a memory.

According to some embodiments of the present disclosure, an aspect of the embodiments of the present disclosure provides a semiconductor structure. The semiconductor structure at least includes two photolithography layers arranged in sequence and at least one blocking layer. Each photolithography layer includes a functional pattern and an overlay mark, and the photolithography layers include a first photolithography layer and a second photolithography layer. The first photolithography layer includes a first functional pattern and a first overlay mark, and the second photolithography layer includes a second functional pattern and a second overlay mark. The blocking layer is located between the first functional pattern and the second functional pattern. A vertical distance between the first functional pattern and the second functional pattern is greater than that between the first and second overlay marks, in a stacking direction of the photolithography layers.

According to some embodiments of the present disclosure, another aspect of the embodiments of the present disclosure further provides a memory, which includes the semiconductor structure described in any one of the above embodiments.

According to some embodiments of the present disclosure, yet another aspect of the embodiments of the present disclosure further provides a method for manufacturing a semiconductor structure. The method at least includes forming two photolithography layers and at least one blocking layer. Each photolithography layer includes a functional pattern and an overlay mark, and the photolithography layers include a first photolithography layer and a second photolithography layer. The first photolithography layer includes a first functional pattern and a first overlay mark, and the second photolithography layer includes a second functional pattern and a second overlay mark. The blocking layer is located between the first functional pattern and the second functional pattern, and a vertical distance between the first functional pattern and the second functional pattern is greater than that between the first and second overlay marks, in a stacking direction of the photolithography layers.

BRIEF DESCRIPTION OF THE DRAWINGS

One or more embodiments are illustrated by the figures in the accompanying drawings corresponding thereto. The illustrations do not constitute a limitation on the embodiments. Unless otherwise stated, the figures in the drawings do not constitute a scale limitation.

DETAILED DESCRIPTION

Figure 1:
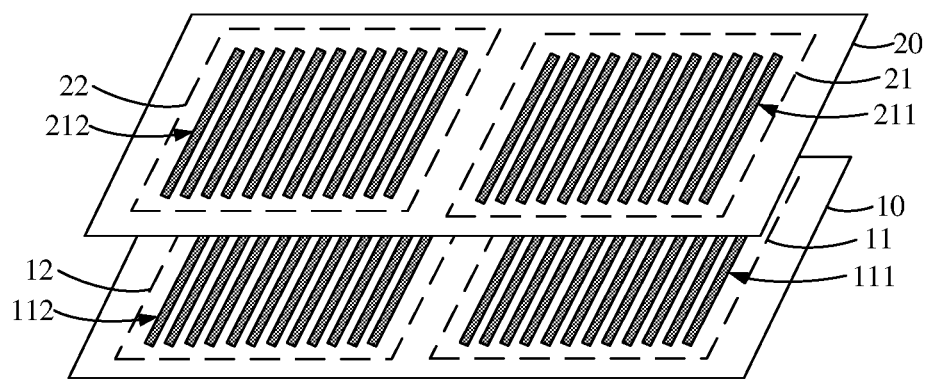
FIG. 1 to FIG. 3 are schematic structural diagrams of a semiconductor structure provided by the embodiments of the present disclosure.

As for an inspection of an overlay error, it is generally divided into an after development inspection (ADI) and an after etching inspection (AEI). The after development inspection refers to a measurement of a critical dimension (CD) after developing, which is generally used to inspect the property index of an exposure and machine and a developing machine. After exposure and development, the generated pattern is qualitatively inspected with an ADI machine to determine whether the pattern is normal or not. Because the measurement can't be done with a transmission light, in the ADI, it is generally done with electron beams or a scanning electron microscope and the like. The after etching inspection refers to a CD measurement after etching, that is, before and after a photoresist is removed in an etching process, a full inspection or a sampling inspection is performed on products.

Generally, the overlay error may be measured by an image based overlay (IBO) technology, a scanning electron microscope (SEM) or an in die metrology (IDM) technology. In the IDM, a zero-order diffraction light of different photolithography layers is collected, and an overlay error of different marking layers is determined according to an asymmetry of the light intensity distribution of the zero-order diffraction light. Ideally, if there is an offset between different photolithography layers (assuming they are a first photolithography layer and a second photolithography layer), the light intensity distribution of the finally collected zero-order diffraction light is apparently asymmetric. The zero-order diffraction light consists of a first diffraction signal corresponding to the first photolithography layer and a second diffraction signal corresponding to the second photolithography layer.

The embodiments of the disclosure provide a semiconductor structure, which is arranged in the stacking direction of photolithography layers. The vertical distance between different overlay marks is greater than the size of overlay marks of corresponding functional patterns. In this way, it is facilitated that a barrier of a film layer between the different overlay marks against transmitted light and reflected light is reduced, ensuring that an exploration light transmitted to a bottom photolithography layer have a high light intensity after being reflected and diffracted, so that a light intensity distribution of finally collected zero-order diffraction light has an apparent asymmetry, avoiding that the light intensity distribution of the finally collected zero-order diffraction light is same as or similar to that of a diffraction signal corresponding to a top photolithography layer because a diffraction signal corresponding to the bottom photolithography layer has a weak light intensity. As a result, the accuracy of measurement results is ensured.

The embodiments of the present disclosure will be described in detail below with reference to the accompanying drawings. However, those of ordinary skill in the art will understand that in the embodiments of the disclosure, many technical details are proposed in order to make readers better understand the disclosure. However, even without these technical details and various changes and modifications based on the following embodiments, the technical solutions claimed in the disclosure can be realized.

Figure 2:
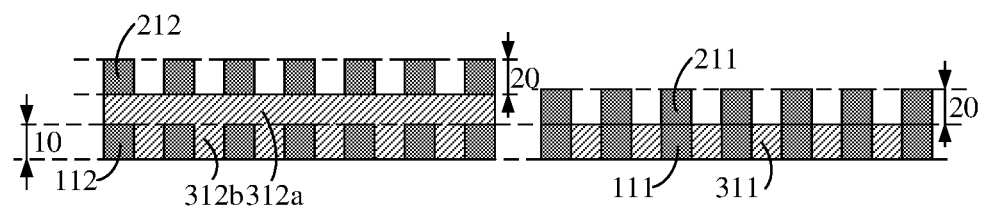
Figure 3:
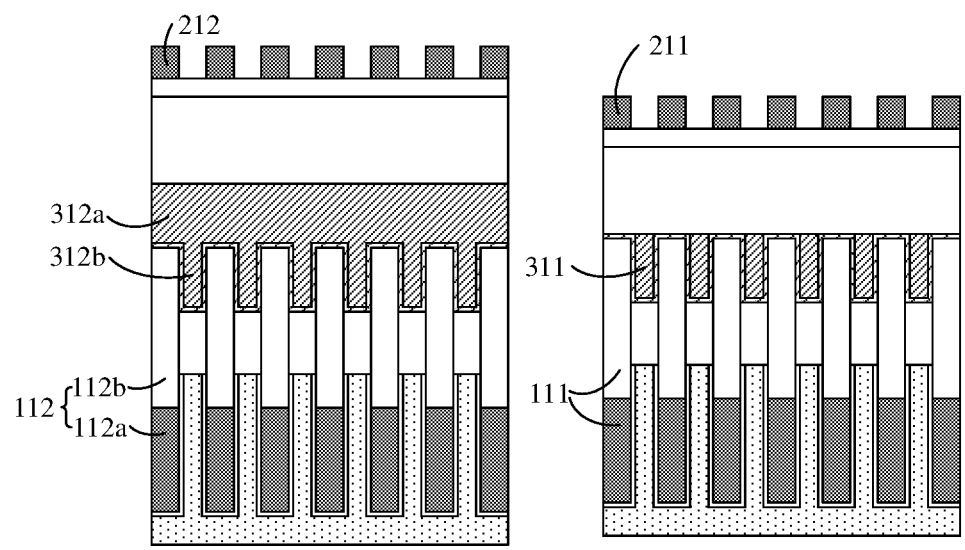

FIG. 1 to FIG. 3 are schematic structural diagrams of a semiconductor structure provided by the embodiments of the present disclosure.

Referring to FIGS. 1 to 2, the semiconductor structure includes two photolithography layers arranged in sequence and at least one blocking layer 312a. Each photolithography layer includes a functional pattern and an overlay mark. The photolithography layers include a first photolithography layer 10 and a second photolithography layer 20. The first photolithography layer 10 includes a first functional pattern 112 and a first overlay mark 111, and the second photolithography layer 20 includes a second functional pattern 212 and a second overlay mark 211. The blocking layer 312a is located between the first functional pattern 112 and the second functional pattern 212. A vertical distance between the first functional pattern 112 and the second functional pattern 212 is greater than that between the first and second overlay marks 111 and 211 in a stacking direction of the photolithography layers.

It can be known that, in general, the target of any process step is the whole photolithography layer. That is, different regions of a same photolithography layer have a same layer structure, or at least two regions have a same layer structure. When the blocking layer 312a is arranged between the first functional pattern 112 and the second functional pattern 212, a corresponding blocking layer is generally also arranged between the first and second overlay marks 111 and 211. When an overlay error of the first overlay mark 111 and the second overlay mark 211 is measured by the IDM technology, the blocking layer located between the first overlay mark 111 and the second overlay mark 211 weakens lights transmitted to and reflected from the first photolithography layer 10, resulting in a weak light intensity of the first diffraction signal corresponding to the first photolithography layer 10.

When the overlay error is calculated using the first diffraction signal corresponding to the first photolithography layer 10 and the second diffraction signal corresponding to the second photolithography layer 20, the asymmetry of the light intensity of the finally collected zero-order diffraction light is weak because the light intensity of the first diffraction signal is weak. As a result, when the overlay error is calculated using a light intensity difference, the calculated overlay error may be smaller than an actual overlay error because an actual light intensity difference corresponding to a same offset is smaller than a preset light intensity difference. In addition, because the light intensity of the first diffraction signal is weak, an interference of external lights to the zero-order diffraction light is more apparent, which easily leads to the calculated overlay error is greater than the actual overlay error. By controlling the vertical distance between the first overlay mark 111 and the second overlay mark 211 to be smaller than the vertical distance between the first functional pattern 112 and the second functional pattern 212, and thinning or even removing the blocking layer between the first overlay mark 111 and the second overlay mark 211, the inhibiting of blocking and weakening of lights by an intermediate layer is facilitated, ensuring that a light intensity distribution of the finally measured zero-order diffraction light has an apparent asymmetry in the presence of an offset, thereby realizing an accurate measurement of the overlay error.

The embodiments of the present disclosure will be described in more detail below with reference to the accompanying drawings.

In some embodiments, the semiconductor structure includes functional areas and scribe lines. A scribe line is located between adjacent functional areas, and the functional patterns and the blocking layer 312a are disposed in the functional areas. Furthermore, in some embodiments, the overlay marks are located in the scribe lines. It can be understood that the functional areas and scribe lines divide the semiconductor structure or a chip into different areas in a plane extension direction. In the stacking direction of the photolithography layers, different photolithography layers have corresponding functional areas and scribe lines. Exemplarily, the first photolithography layer 10 includes a first scribe line 11 and a first functional area 12. The first overlay mark 111 is located in the first scribe line 11, and the first functional pattern 112 is located in the first functional area 12. Correspondingly, the second photolithography layer 20 includes a second scribe line 21 and a second functional area 22. The second overlay mark 211 is located in the second scribe line 21, and the second functional pattern 212 is located in the second functional area 22.

In the photolithography layer stacking direction, a projection of the first scribe line 11 and that of the second scribe line 21 coincide, and a projection of the first functional area 12 and that of the second functional area 22 coincide. In addition, the first scribe line 11 and the first functional area 12 may or may not be in a same plane, and correspondingly, the second scribe line 21 and the second functional area 22 may or may not be in a same plane.

In some embodiments, an integrated structure including the blocking layer 312a is also located in at least one of following positions: in the first photolithography layer 10, in the second photolithography layer 20, beneath the first photolithography layer 10 or on the second photolithography layer 20. "Beneath the first photolithography layer 10" refers to the side of the first photolithography layer 10 facing away from the second photolithography layer 20, and "on the second photolithography layer 20" refers to the side of the second photolithography layer 20 facing away from the first photolithography layer 10.

In some embodiments, the functional pattern and the overlay mark are composed of convex structures arranged in an array. The semiconductor structure further includes a filling part, which is filled between adjacent convex structures. The blocking layer and the filling part are the integrated structure. Exemplarily, referring to FIG. 2, the semiconductor structure includes a first filling part 312b located in the functional area and a second filling part 311 located in the scribe line. The first filling part 312b is filled between adjacent first functional patterns 112, and the second filling part 311 is filled between adjacent first overlay marks 111. The blocking layer 312a covers surfaces of the first filling part 312b and the first functional patterns 112. The first filling part 312b and the blocking layer 312 are the integrated structure.

In some embodiments, a process operation of forming the first filling part 312b, the second filling part 311 and the blocking layer 312a includes: after forming the first functional pattern 112 and the first overlay mark 111, performing a deposition process to simultaneously form the first filling part 312b and the second filling part 311; and after forming the second filling part 311, covering the scribe line and exposing the functional area, and continuing to deposit to form the blocking layer 312a. It can be understood that in this process operation, the first filling part 312b, the second filling part 311 and the blocking layer 312a are formed by a same process operation. The first filling part 312b and the second filling part 311 are the integrated structure, and the first filling part 312b and the blocking layer 312a form the integrated structure.

In another embodiment, different deposition processes are used to deposit the materials of the functional areas and the scribe lines, respectively. Exemplarily, firstly, the functional area is covered and the scribe line is exposed, and the second filling part 311 is formed by depositing by a first deposition process; then the scribe line is covered and the functional area is exposed, and the first filling part 312b and the blocking layer 312a are formed by depositing by a second deposition process.

In some embodiments, the blocking layer 312a is only disposed between the first functional pattern 112 and the second functional pattern 212. In other embodiments, one blocking layer is further disposed between the first and second overlay marks, and the thickness of the blocking layer disposed between the overlay marks is smaller than that of the blocking layer disposed between the functional patterns. In addition, the blocking layer 312a may be either a single film layer or a stacked structure. The blocking layer 312a refers to a film layer that can block and weaken lights, but not a film layer specifically used to block lights, or other mediums or ions. That is, the material of the blocking layer 312a is not limited herein. It is generally believed that all film layers can play a block role on a propagation of lights.

In some embodiments, the convex structures include lines or bumps. The line is a convex structure extending in one direction, with a large aspect ratio, and the bump is a protruding structure with a small aspect ratio. A shape of the line or bump is not limit herein, as long as the corresponding diffraction signal can be formed. For example, the shape of the bump may be a square, a rectangle, a parallelogram or other shapes.

In some embodiments, a functional pattern and an overlay mark are composed of cavity structures arranged in an array. The semiconductor structure further includes a filling part, which is filled in the cavity structures. The blocking layer and the filling part are the integrated structure. That is, the functional pattern and the overlay mark may be not only a solid structure such as a convex structure, but also a hollow structure such as a cavity structure. The cavity structures include gaps or holes. The gap corresponds to the line and extends in one direction, and the hole corresponds to the bump and is convex or concave relative to surroundings. In addition, if the functional patterns and the overlay marks are hollow structures, the hollow structures may not be filled with other materials.

In addition, the material of the blocking layer 312a may be a dielectric material or a conductive material. The dielectric material includes silicon oxide, silicon nitride, silicon oxynitride, aluminum oxide, etc. The conductive material includes a doped conductive material (for example, doped polysilicon), a metal (for example, tungsten, copper, silver or gold) and a metal compound (for example, titanium nitride and indium tin oxide). In an actual production process, in order to avoid a big height difference between a functional area and a scribe line, it is necessary to limit a thinning degree of the blocking layer 312a. Under this background, a film layer composed of a material with a stronger light blocking property may be selected to thinned, so as to improve the asymmetry of the light intensity distribution of the finally collected zero-order diffraction light and realize the accurate measurement of the overlay error.

In some embodiments, the functional patterns and the corresponding overlay marks are periodic grating structures, and grating arrangement directions of the functional patterns and the corresponding overlay marks are the same. In another embodiment, the functional patterns and the corresponding overlay marks are periodic grating structures, but each photolithography layer has multiple groups of overlay marks. There are at least two different grating arrangement directions in the multiple groups of overlay marks, and the two different grating arrangement directions may be perpendicular to each other. The grating arrangement direction of the functional patterns is the same as that of one group of the overlay marks. In yet another embodiment, the functional patterns and the corresponding overlay marks are periodic grating structures. The grating arrangement direction of the functional patterns is different from that of the corresponding overlay marks, and the grating arrangement direction of the functional patterns is perpendicular to or oblique to the grating arrangement direction of the overlay marks.

The following will be described in detail with reference to specific embodiments. Referring to FIG. 3, in the functional areas of the semiconductor structure, the first functional pattern 112 includes buried word lines 112a and isolation layers 112b for isolating the buried word lines 112a. The isolation layers 112b are located on the buried word lines 112a. The blocking layer 312a is a conductive film for forming a bit line conductive film. Part of the conductive film is located between adjacent isolation layers 112b, and another part of the conductive film is located on the isolation layers 112b. The part of the conductive film located between adjacent isolation layers 112b serves as the first filling part 312b, and the part of the conductive film located on the isolation layers 112b serves the blocking layer 312a. The second functional pattern 212 is a developing layer. The developing layer is a mask structure left after exposure and development. By etching the conductive film with the mask structure, a plurality of discrete bit line conductive layers can be obtained. Accordingly, in the scribe lines of the semiconductor structure, part of the conductive film between adjacent first overlay marks 111 is only provided as the second filling part 311. That is, by removing or not forming the conductive film on the first overlay marks 111, it is beneficial to prevent the part of the conductive film from blocking incident lights and the first diffraction signal formed after being reflected and diffracted, and ensure that the first diffraction signal has a strong light intensity, thus ensuring that a zero-order diffraction lights composed of the first diffraction signal and the second diffraction signal has an apparent asymmetry in the light intensity distribution, and accurately obtaining an overlay error between the first functional pattern 112 and the second functional pattern according to the first overlay mark 111 and the second overlay mark 211.

In some embodiments, whether the overlay marks or the functional patterns, and whether the filling layer filled in the hollow overlay marks or the filling layer filled between the solid overlay marks may be a stacked structure, respectively. Assuming that the stacking direction of the photolithography layers is a vertical direction, the stacked structure here may be stacked in the vertical direction or in a horizontal direction, or the above two stacking relationships may also present at the same time. Understandably, the horizontal direction is perpendicular to the vertical direction.

In the embodiments of the disclosure, in the stacking direction of the photolithography layers, the vertical distance between the first and second overlay marks is smaller than that between the first and second functional patterns. In this way, it is beneficial to avoid that the light transmitted to the first photolithography layer is weakened by the film layer between the first and second overlay marks, and to avoid that the first diffraction signal formed after being reflected by the first overlay marks is weak. As a result, it is ensured that the first diffraction signal corresponding to the first overlay mark and the second diffraction signal corresponding to the second overlay mark have an apparent asymmetry of light intensity distribution after overlapping, so as to avoid that the light intensity distribution of the overlapped signal is influenced by external lights or tends to be symmetrical, thereby accurately measuring an overlay error of different photolithography layers.

Correspondingly, the embodiments of the disclosure further provide a memory, which includes the semiconductor structure described in any one of the above embodiments. The memory prepared based on the semiconductor structure can better amend or even eliminate an overlay error of functional areas, and ensure that different functional patterns in the functional areas have a high aligning accuracy, so that different functional components in the functional areas have corresponding preset electrical properties, and the memory has preset electrical properties, and the electrical properties of different memories are relatively stable Correspondingly, the embodiments of the disclosure further provide a method for manufacturing a semiconductor structure, which is for manufacturing any of the above semiconductor structures. Referring to FIG. 1 and FIG. 2, the method for manufacturing a semiconductor structure may at least include: forming two photolithography layers arranged in sequence and at least one blocking layer 312a. Each photolithography layer includes a functional pattern and an overlay mark, and the photolithography layers include a first photolithography layer 10 and a second photolithography layer 20. The first photolithography layer 10 includes a first functional pattern 112 and a first overlay mark 111, and the second photolithography layer 20 includes a second functional pattern 212 and a second overlay mark 211. The blocking layer 312a is located between the first functional pattern 112 and the second functional pattern 212, and a vertical distance between the first functional pattern 112 and the second functional pattern 212 is greater than that between the first and second overlay marks 111 and 211 in a stacking direction of the photolithography layers.

In some embodiments, the semiconductor structure includes functional areas and scribe lines. A scribe line is located between adjacent functional areas. A process operation of forming the blocking layer and the second photolithography layer 20 include: after forming the first photolithography layer 10, covering the scribe line and exposing the functional area; forming a blocking layer 312a located in the functional area and on the first functional pattern 112; and forming the second photolithography layer 20, which covers a top surface of the blocking layer 312a and a top surface of the scribe line of the first photolithography layer 10.

It can be understood that the covering the scribe line above mentioned may refer to performing a selective deposition process to form the blocking layer 312a only in the functional area, and may also refer to the following operations: a sacrificial layer is formed on the top surface of the scribe line of the first photolithography layer 10, then a maskless deposition process is performed, and finally, the sacrificial layer and the blocking medium on the sacrificial layer are removed, leaving only the blocking layer 312a on a top surface of the functional area of the first photolithography layer 10. Adopting a mask deposition process or a sacrificial layer covering process to form the blocking layer 312a is beneficial to avoid a damage to the first overlay mark 111 due to the etching of the barrier material, so as to ensure that the first overlay mark 111 has a good integrity, and to ensure that a first diffraction signal formed based on the first overlay mark 111 can better reflect a position signal of the first functional pattern 112, thus ensuring that an overlay error obtained based on the first overlay mark 111 and the second overlay mark 211 can be used to amend a position of the second functional pattern 212.

In other embodiments, a barrier film may be formed by a maskless deposition process firstly, and then the barrier film on the scribe line of the first photolithography layer is removed by etching, leaving the barrier film on the functional area of the first photolithography layer as the blocking layer.

In the embodiments of the disclosure, in the stacking direction of the photolithography layers, the vertical distance between the first and second overlay marks is smaller than that between the first and second functional patterns. In this way, it is beneficial to avoid that light transmitted to the first photolithography layer is weakened by a film layer between the first and second overlay marks, and to avoid that the first diffraction signal formed after being reflected by the first overlay mark is weak. As a result, it is ensured that the first diffraction signal corresponding to the first overlay mark and a second diffraction signal corresponding to the second overlay mark have an apparent asymmetry of light intensity distribution after overlapping, so as to avoid that a light intensity distribution of the overlapped signal is influenced by external lights or tends to be symmetrical, thereby accurately measuring an overlay error of different photolithography layers.

It can be understood by those skilled in the art that the above-mentioned implementation modes are specific embodiments for implementing this disclosure, and in practical applications, various changes in form and details may be made without departing from the spirit and scope of this disclosure. Any person skilled in the art may make changes and modifications without departing from the spirit and scope of this disclosure, so the scope of protection of this disclosure shall be subject to the scope defined in the claims.

The invention claimed is:
1. A semiconductor structure, comprising:
two photolithography layers arranged in sequence, wherein each photolithography layer comprises a functional pattern and an overlay mark, and the photolithography layers comprise a first photolithography layer and a second photolithography layer, wherein the first photolithography layer comprises a first functional pattern and a first overlay mark, and the second photolithography layer comprises a second functional pattern and a second overlay mark; and at least one blocking layer, wherein the blocking layer is only disposed between the first functional pattern and the second functional pattern, and a vertical distance between the first functional pattern and the second functional pattern is greater than a vertical distance between the first overlay mark and the second overlay mark, in a stacking direction of the photolithography layers.

2. The semiconductor structure according to claim 1, wherein the semiconductor structure comprises functional areas and scribe lines, wherein a scribe line is located between adjacent functional areas, and the functional pattern and the blocking layer are disposed in the functional areas.

3. The semiconductor structure according to claim 2, wherein the overlay mark is located in the scribe lines.

4. The semiconductor structure according to claim 1, wherein an integrated structure comprising the blocking layer is further located in at least one of following positions: in the first photolithography layer, in the second photolithography layer, beneath the first photolithography layer or on the second photolithography layer.

5. The semiconductor structure according to claim 4, wherein the functional pattern and the overlay mark are composed of convex structures arranged in an array;

and the semiconductor structure further comprises a filling part, wherein the filling part is filled between adjacent convex structures, and the blocking layer and the filling part are the integrated structure.

6. The semiconductor structure according to claim 5, wherein the convex structures comprise lines or bumps.

7. The semiconductor structure according to claim 4, wherein the functional pattern and the overlay mark are composed of cavity structures arranged in an array;

and wherein the semiconductor structure further comprises a filling part, wherein the filling layer is filled in the cavity structures, and the blocking layer and the filling part are the integrated structure.

8. The semiconductor structure according to claim 7, wherein the cavity structures comprise gaps or holes.

9. The semiconductor structure according to claim 1, wherein a material of the blocking layer comprises a conductive material.

10. The semiconductor structure according to claim 9, wherein the conductive material comprises tungsten.

11. The semiconductor structure according to claim 1, wherein the functional pattern comprises a periodic grating structure arranged in a first direction, and the overlay mark at least comprises another periodic grating structure arranged in the first direction.

12. The semiconductor structure according to claim 11, wherein the overlay mark further comprises a periodic grating structure arranged in a second direction, wherein the second direction is perpendicular to the first direction.

13. A memory, comprising the semiconductor structure according to claim 1.

14. A method for manufacturing semiconductor structure, comprising:

forming two photolithography layers and at least one blocking layer, wherein each photolithography layer comprises a functional pattern and an overlay mark, and the photolithography layers comprise a first photolithography layer and a second photolithography layer, wherein the first photolithography layer comprises a first functional pattern and a first overlay mark, and the second photolithography layer comprises a second functional pattern and a second overlay mark; and wherein the blocking layer is only disposed between the first functional pattern and the second functional pattern, and a vertical distance between the first functional pattern and the second functional pattern is greater than a vertical distance between the first overlay mark and the second overlay mark, in a stacking direction of the photolithography layers.

15. The method for manufacturing a semiconductor structure according to claim 14, wherein the semiconductor structure comprises functional areas and scribe lines, wherein a scribe line is located between adjacent functional areas; and wherein forming the blocking layer and the second photolithography layer comprises:

after forming the first photolithography layer, covering the scribe line and exposing the functional area;

forming the blocking layer, wherein the blocking layer is located in the functional area and on the first functional pattern; and forming the second photolithography layer, wherein the second photolithography layer covers a top surface of the blocking layer and a top surface of the scribe line of the first photolithography layer.

* * * * *